United States Patent
Sternowski

(10) Patent No.: US 11,290,143 B1
(45) Date of Patent: Mar. 29, 2022

(54) PERSONAL ELECTRONIC DEVICE EMP PROTECTIVE ENCLOSURE

(71) Applicant: Softronics, Ltd., Marion, IA (US)

(72) Inventor: Robert H. Sternowski, Cedar Rapids, IA (US)

(73) Assignee: Softronics, Ltd., Marion, IA (US)

(*) Notice: Subject to any disclaimer, the term of this patent is extended or adjusted under 35 U.S.C. 154(b) by 0 days.

(21) Appl. No.: 17/483,294

(22) Filed: Sep. 23, 2021

Related U.S. Application Data

(60) Provisional application No. 63/162,298, filed on Mar. 17, 2021.

(51) Int. Cl.
 *H04B 1/38* (2015.01)
 *H04B 15/02* (2006.01)
 *H05K 9/00* (2006.01)
 *H04B 1/3888* (2015.01)
 *H02H 9/04* (2006.01)
 *H01Q 1/12* (2006.01)

(52) U.S. Cl.
 CPC ............. *H04B 1/3888* (2013.01); *H01Q 1/12* (2013.01); *H02H 9/04* (2013.01); *H05K 9/0081* (2013.01)

(58) Field of Classification Search
 None
 See application file for complete search history.

(56) References Cited

U.S. PATENT DOCUMENTS

| | | | | |
|---|---|---|---|---|
| 5,796,578 A | * | 8/1998 | Jones | G06F 1/1616 |
| | | | | 174/375 |
| 7,969,748 B2 | * | 6/2011 | Niederkorn | H05K 9/0032 |
| | | | | 361/816 |
| 8,270,929 B1 | | 9/2012 | Koeppel | |
| 2004/0198264 A1 | | 10/2004 | Saur | |
| 2005/0090299 A1 | | 4/2005 | Tsao | |
| 2007/0259704 A1 | * | 11/2007 | Jung | H04B 1/3838 |
| | | | | 455/575.8 |
| 2010/0240421 A1 | | 9/2010 | Sekora | |
| 2011/0205129 A1 | * | 8/2011 | Koshi | H01Q 1/243 |
| | | | | 343/702 |
| 2013/0206470 A1 | * | 8/2013 | Davis | H01R 13/72 |
| | | | | 174/382 |
| 2014/0159980 A1 | * | 6/2014 | Finegold | H01Q 1/526 |
| | | | | 343/833 |

* cited by examiner

*Primary Examiner* — Pablo N Tran
(74) *Attorney, Agent, or Firm* — Shuttleworth & Ingersoll, PLC; Jason R. Sytsma

(57) ABSTRACT

A Faraday cage enclosure for a mobile device with a portion that aligns with a display of the mobile device simultaneously substantially attenuate EM radiation to non-damaging amplitudes and is transparent to visible light in an optical spectrum, an EMP protection circuit electrically connected between the external charging and data port and the internal charging and data port, and a passive repeater configured to EM-couple with an antenna of the mobile device and relay signals to and from the antenna of the mobile device.

16 Claims, 10 Drawing Sheets

PERSONAL ELECTRONIC DEVICE EMP PROTECTIVE ENCLOSURE

PRIORITY CLAIM

This application claims priority to U.S. Provisional Patent Application No. 63/162,298 filed on Mar. 17, 2021, the contents of which are hereby incorporated by reference herein.

TECHNICAL FIELD

The present invention relates generally to mobile cellular, wireless or Wi-Fi device accessories, and more particularly to a protective enclosure capable of protecting the device from an electro-magnetic pulse.

BACKGROUND INFORMATION

It is well understood that a high intensity electromagnetic wavefront generated by a nuclear detonation (or alternatively by special non-nuclear means) contains sufficient energy to induce destructive currents in conductive materials as it flows through and around them. Such a pulse is typically 100-200 nanoseconds in duration, with intensities on the order of 50 KV/m to 1 MV/m with the majority of energy concentrated in the 10-1000 MHz spectrum. In particular, in the case of electronic equipment, EMP generates currents in microelectronic components, wires, printed circuit traces, etc., sufficient to vaporize or fuse those electronic elements, rendering them inoperative. One of the most fearsome threats to the United States is detonation of a low yield, EMP-optimized nuclear device in low earth orbit (approx. 200-400 km) over the geographic center of the United States, producing an EMP wave that will sweep across all of the continental U.S. and fully disable the power and communications grids. Multiple nation-states are capable of carrying out such an indirect attack. The resulting damage would be permanent, and leave the US with its industrial base also disabled and unable to repair or replace damaged electronics.

It is obvious that, in the face of such threats the US government, and the Department of Defense in particular, have a serious need for communications equipment that can survive such an event, and allow intra-government (at a minimum) communications to defend and recover from such an episode. The driving impetus for the disclosed invention is the protection and survival of cellular telephones and handheld radio transceivers. These are complex assemblies of miniature electronic components and interconnecting metal wires of various kinds, all of which are subject to damage by induced currents from a high-power EMP electromagnetic wavefront.

It is well-known to those skilled in the art that the simplest and most effect method for protection of such devices from high-intensity electromagnetic fields is to 100% contain them in a Faraday cage. A Faraday cage is simply a sealed conductive box with the device to be protected located inside of it. With the device installed inside of a sealed box with no openings, the device is obviously non-functional without a means for a user to physically or remotely access it. Such a Faraday cage is, on the other hand, a useful means of storing a vulnerable item protected from EMP damage. After the episode, the cage/packaging can be opened and the undamaged device removed and used. The physics principle in action is the conductive metal comprising the walls of the Faraday cage. Electromagnetic waves cannot penetrate metal, and hence a powerful EMP wavefront will harmlessly induce high currents in the surface of the Faraday cage, which will be harmlessly dissipated as heat as they flow about the cage's surface.

Government and defensive units, however, have a need to be able to communicate before, during and after a nuclear attack (commonly referred to as pre-, trans- and post-attack periods). Thus the government has a serious need for protected devices that will both survive and operate during all three phases.

The prior art is full of cases to protect a user of a mobile device from perceived harmful electro-magnetic frequency (EMF) radiation. These cases operate on a similar principal of incorporating a Faraday cage around the device, but all of the prior art cases leave portions of the case radio-transparent in order to maintain functionality of the device. While such cases may block a large portion of the EMF radiation from device while still allowing functionality for the user, having any radiation-transparent surface on the case leaves the mobile device susceptible to damage from an EMP.

What is disclosed is protective enclosure for a personal communication device to be protected and operated during an EMP event; conversely, the enclosure can also be used to provide a general consumer with a case that provides superior protection against EMF radiation from the personal communication device.

SUMMARY

In accordance with one aspect of the present invention, disclosed is a case for a mobile device. The case comprises of an enclosure that has a bottom portion for cradling the mobile device therein, a top cover, and an electrically-conductive hinge connecting the bottom portion to the top cover to both selectively open and close the enclosure and provide a low-impedance electrical path between bottom portion and the top cover of the case.

In an embodiment, the top cover further comprises of a portion that aligns with a display on the on mobile device that substantially attenuates EM radiation to non-damaging amplitudes and is transparent to visible light in an optical spectrum. The portion of the top cover comprises of a metallic mesh that simultaneously substantially attenuates EM radiation and is transparent to visible light in an optical spectrum. The metallic mesh is oriented with its threads at a 45 degree angle to an x-y orientation of the display of the mobile device for preventing Moiré patterns and enhancing clarity of the display. The top cover has orthogonal sidewalls extending downward that overlap orthogonal sidewalls of the bottom portion to reduce a radiation leakage path by.

The case can also have an external charging and data port on the outside of the enclosure. An internal charging and data port on the inside of the enclosure is configured to receive the charging and data port of the mobile device. An EMP protection circuit is electrically connected between the external charging and data port and the internal charging and data port.

A passive repeater configured to EM-couple with an antenna of the mobile device and relay signals to and from the antenna of the mobile device can be provided. An EMP limiter can be connected to the passive repeater to attenuate voltages above a threshold. The passive repeater can further comprise an internal repeater antenna inside the enclosure and configured to EM-couple with an antenna of the mobile device. An external repeater antenna can be positioned outside of the enclosure with a transmission line extending between the internal repeater antenna and the external repeater antenna.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
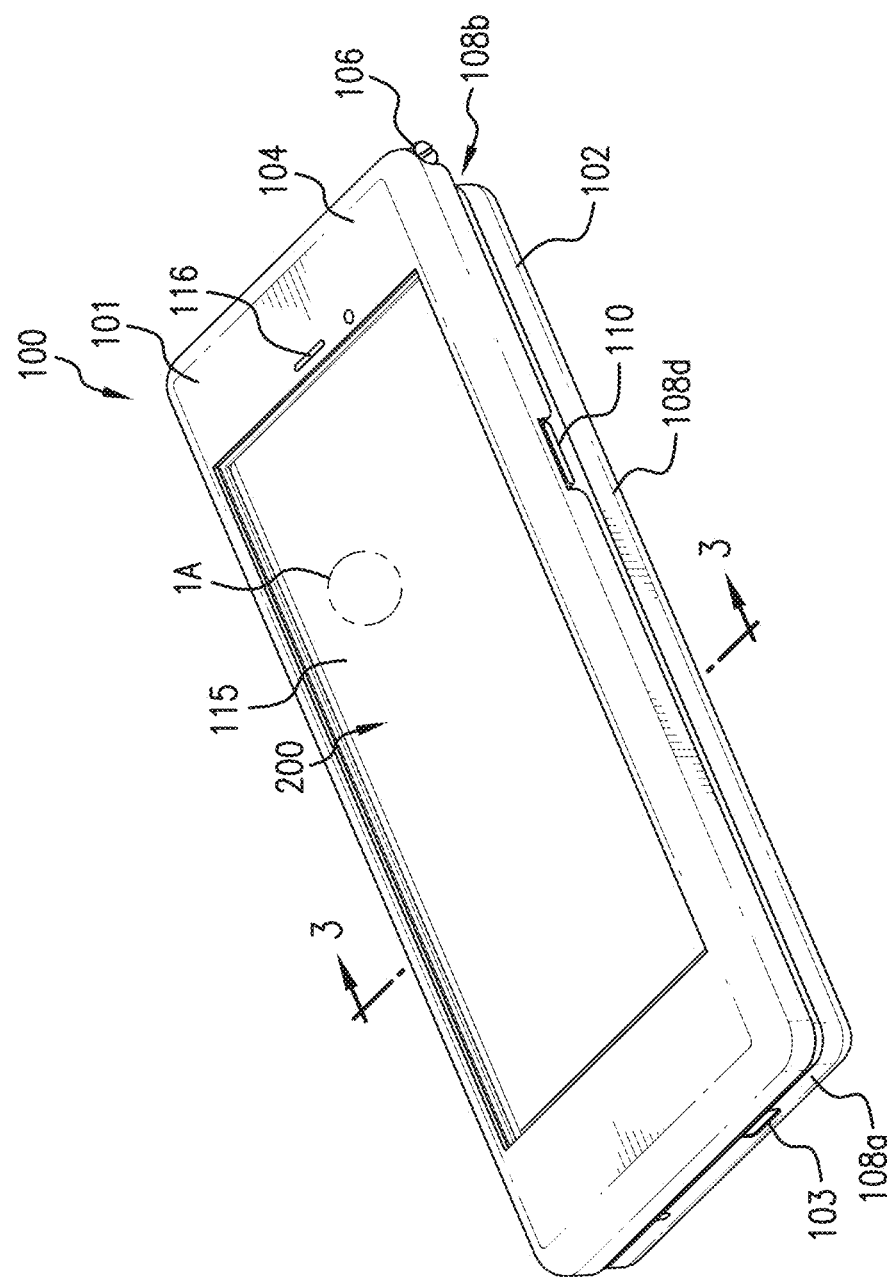
FIG. 1 shows a front-side perspective view of a protective case for a mobile device according to this disclosure.

FIGS. 1-5 show a case 100 for protecting a mobile device 200 from an electromagnetic pulse (EMP) or, conversely, for protecting a user from electromagnetic frequency (EMF) radiation from mobile device 200. This disclosure will be directed to describing case 100 from the point of view of protecting mobile device 200 from EMP, but those skilled in the art will recognize that case 100 provides superior protection from EMF. Reference to EMP and EMF radiation refers to that portion of the EM-spectrum referred to as the "radio spectrum." Importantly, case 100 can protect mobile device 200 from harmful radiation in the radio spectrum without having to disassemble or modify mobile device 200 in any way and without attenuating radiation in the optical spectrum, which makes case 100 easily adaptable for any user. Case 100 also allows the user to place and receive cellular calls (voice, data, text, or any other standard capabilities of an unprotected cellphone), read the display, manipulate the touchscreen and tactile controls, charge the cellphone's battery, and use the data and headphone port signal lines all while installed in the EMP protective enclosure of case 100.

To provide this superior protection, case 100 is implemented as a modified Faraday cage to enclose and protect mobile device 200 from the EMP while allowing a user access to needed functionality, as described above. Case 100 simultaneously permits mobile device 200 to survive and be usable before, during and after a nuclear attack. Case 100 allows for sound transmission, light transmission, tactile motion (e.g., access to pushbuttons, knobs, etc.), primary power and other electrical signals through case 100 to the circuitry of mobile device 200.

Generally, a passive repeater is used to apply external radio signals to the internal antenna of mobile device 200. A limiter circuit can prevent excessive EMP energy from entering an internal antenna of mobile device 200. Similarly, an external charging and data port 103 (USB, Lightning, or the like) on case 100 connects to an external charger, routes the charging current through a lowpass filter and limiter circuit inside case 100 to an internal charging and data port 106 (USB, Lightning, or the like) that connects to a charging and data port 201 of mobile device 200. Generally, charging and data port 201 of mobile device 200 is a female connecting port which connects to a male connecting port of internal charging and data port 106 inside enclosure 101 while external charging and data port 103 is a female connecting port to connect with the male end of the external charging cable.

All limiter and lowpass circuits are implemented on a small interface board inside case 100 where the ground plane layer serves as part of the Faraday cage surface. A small radio-transparent elastomer radome covers the external antenna, primarily for aesthetic and shock protection purposes. An electrically-conductive hinged metal visor with the protective mesh bonded to it allows reading the LCD display of mobile device 200 with the EMP protection in place. To enter data via the touchscreen of mobile device 200, the visor must be temporarily opened (exposing the device to EMP damage unless the user physically protects the device from EMP exposure via other means). Case 100 provides all of this functionality without need to modify mobile device 200. Mobile device 200 simply mounts and plugs into case 100 in a manner similar to standard protective cases with built in spare batteries. This provides case 100 with a level of familiarity that inhibits any misuse or operator error.

Case 100 comprises of an enclosure 101 with a hinged "visor" that completely surrounds mobile device 200. This hinged "visor" mechanically and electrically connected to the Faraday cage of enclosure 101 has a portion that aligns with the display where there is a cutout which fully reveals the display of mobile device 200. The cutout contains an optically-transmissive fine wire mesh which provides 80 db of radio attenuation. The mesh is sandwiched between two sheets of transparent plastic for damage and wear protection, with the mesh bonded to the grounded visor frame. Because the standard input entry touchscreen for mobile device 200 is capacitive, it will not function through a grounded mesh screen. Therefore, the user must open the visor to use the touchscreen of mobile device 200. Opening the visor, however, exposes mobile device 200 to EMP damage, requiring the user to take care where and when he opens it. This tradeoff recognizes that most use in emergency conditions is receiving or sending audio or receiving text/data.

More specifically, enclosure 101 can comprise a bottom portion 102 and a top cover 104 connected together by a hinge 106 which provides a low-impedance electrical path between bottom portion 102 and top cover 104 of enclosure 101. Mobile device 200 fits into bottom portion 102. In this arrangement, bottom portion 102 can be configured as a cradle with a back side 107 and four side walls 108a, 108b, 108c, and 108d that extend upward and inward from back side 107 to provide protection for the sides of mobile device 200. Inward portion 109 of side walls 108a, 108b, 108c, and 108d overlap mobile device 200 for reasons discussed below. The bottom side wall 108a is considered the side corresponding to the charging ports and the top side wall 108b corresponds to the opposite side.

Side wall 108d can further comprise a button extender 110 that extends perpendicularly outward with a through hole extending there through for receiving a pin 111 to connect top cover 104 to bottom portion 102 to create hinge 106, which allows enclosure 101 to be opened and closed to insert and remove mobile device 200. Various arrangements of enclosure 101 that allows for the insertion and removal of mobile device 200 are contemplated herein. The important feature of all such arrangements is that enclosure 101 completely surrounds mobile device 200 with no gaps larger than one-tenth of a wavelength in size over the frequency range of the threat energy, which is primarily 10 MHz (100 feet wavelength) to 1000 MHz (12 inch wavelength).

Enclosure 101 comprises of a high conductivity material (e.g., metal, metallic foil, metallic film, metallic mesh, metallic fabrics, metallic coatings, metal nanoparticles, etc.) that allows continuous electrical conductivity over all of its surfaces to dissipate induced currents. This means enclosure 101 can be constructed in a variety of ways, including, but not limited to, metal shells, plastic shells with metallic coatings, or even transparent coverings made from metallic film, mesh, fabrics or nanoparticles that provide high conductivity with visible light transparency.

Figure 1A:
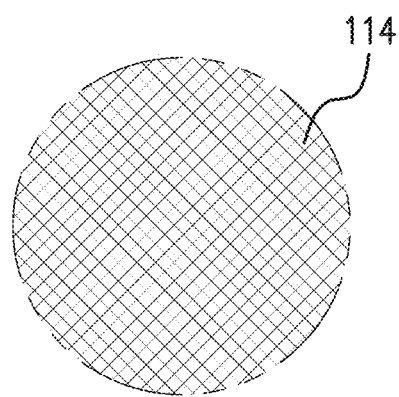
FIG. 1A is a close-up view of area 1A of FIG. 1.
Figure 2:
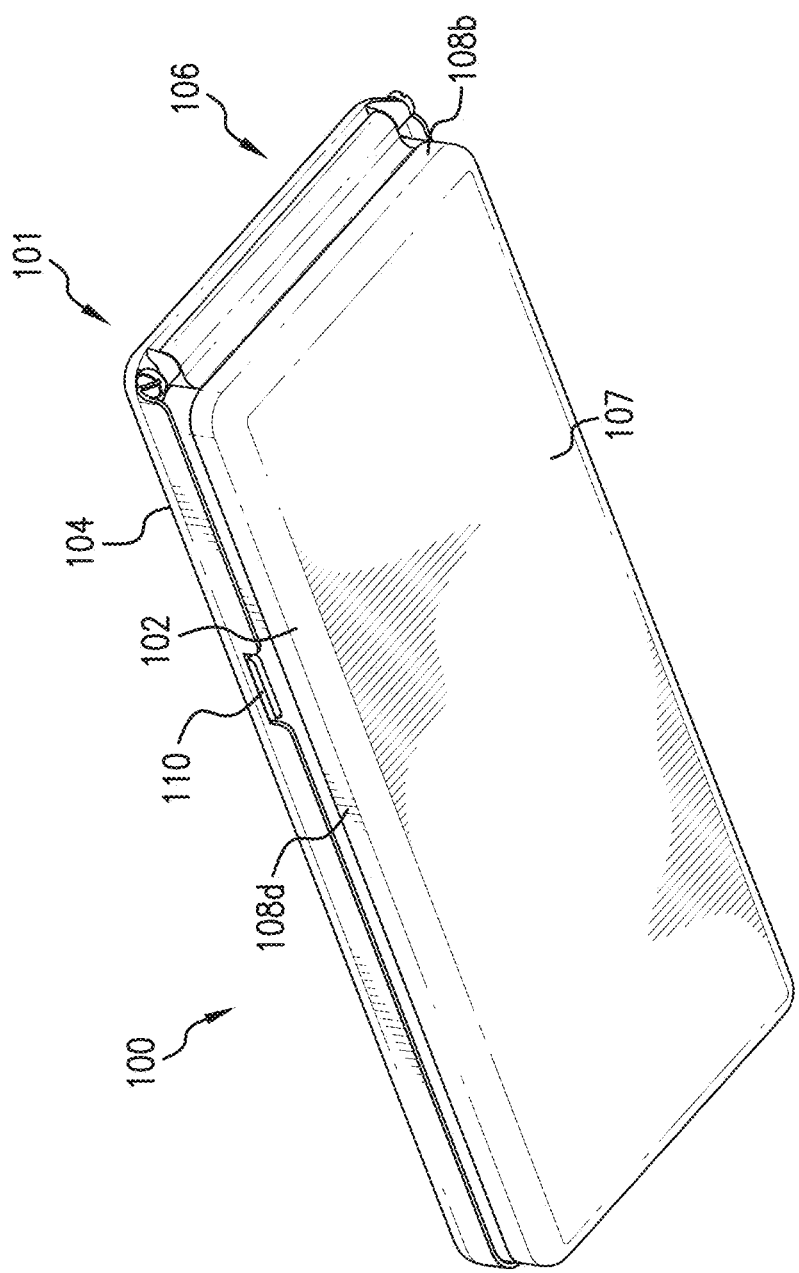
FIG. 2 shows a back-side perspective view of the protective case of FIG. 1
Figure 3:
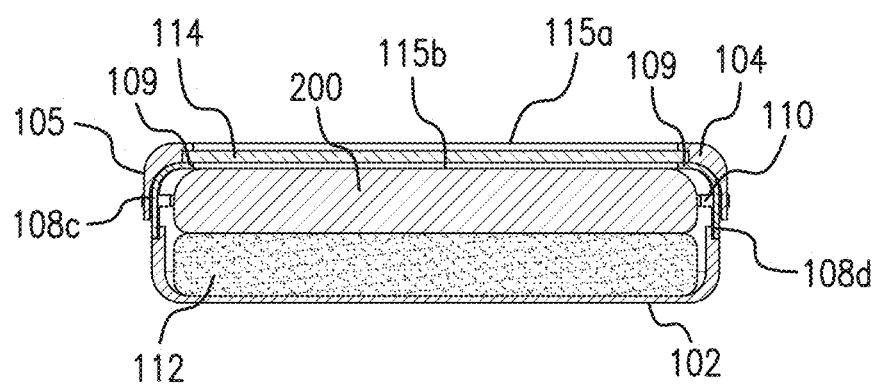
FIG. 3 shows a cross-sectional view of the case of FIG. 1 taken along the line A-A.

Top cover 104 of enclosure 101 allows for transmission of visible light. A high conductivity yet visible light transparent plastic cover 115 overlaid a mesh screen 114, as shown in FIG. 1A and FIG. 3, is combined to top cover 104 and is configured to overlay the display of mobile device 200. Mesh screen 114 is configured with holes no larger than one-tenth the wavelength of the EM waves from an EM pulse through which the light from the display can shine and be reflected. In one implementation, mesh screen 114 comprises of a fine metallic mesh of 50-200 threads/inch with 0.001-0.002 inch diameter with spacing between the threads for openings that are typically 0.020 to 0.004 inches. This allows enough light through for reading the display via light transmission between the threads of the metallic mesh. Mesh screen 114 can be bonded to between two layers of plastic, a plastic cover 115a and a plastic cover 115b, which allows mesh screen 114 to dissipate surface currents induced by an EMP while providing clear protective layers on each side. To prevent more patterns from occurring when mesh screen 114 is overlaid on the x-y linear pixel LCD screen of mobile device 200, mesh screen 114 is oriented with its threads running at a 45 degree angle to the x-y pixel grid (see FIG. 1A) for preventing Moiré patterns and enhancing clarity of the display.

One shortcoming of case 100 is that the capacitive touchscreen now commonly found in most mobile devices 200 implemented as cellphones and personal electronics will not operate with a conductive mesh screen 114 installed over the top. The capacitive charge of a fingertip is evenly distributed over the protective mesh, and becomes roughly equivalent to pressing the palm of your hand to the entire touchscreen simultaneously. This provides no useful function. If the touchscreen is to be used, mesh screen 114 must be removed for the duration of the input operations. For this reason, enclosure 101 configured with a top cover 104 connected to a bottom portion 102 by a hinge 106 that allows top cover 104 to be temporarily lifted for access to the touchscreen display of mobile device 200 may be preferred. The user, however, would be cautioned that mobile device 200 would not be protected from EMP with top cover 104 opened.

As can be seen in FIG. 3, a z-shaped joint is formed by the overlay of top cover 104 on bottom portion 102 to create a circuitous path to reflect EM waves off the corners of the joint in enclosure 101. Vertical sides 105 of top cover 104, when closed, extend downward to overlap side wall 108c and side wall 108d of bottom portion 102. This flange created by vertical sides 105 forces a circuitous radio energy path between top cover 104 and bottom portion 102 that enhances the rejection of damaging radio power entering the Faraday cage of enclosure 101.

Enclosure 101 of case 100 can be provided with one or more hole patterns 116 for sound transmission to and from speakers and microphones. Each hole pattern 116 is configured to align with a corresponding hole pattern on mobile device 200, and is less than one-tenth of the EMP wavelength, which is on the order of 0.010 inch diameter.

Figure 4:
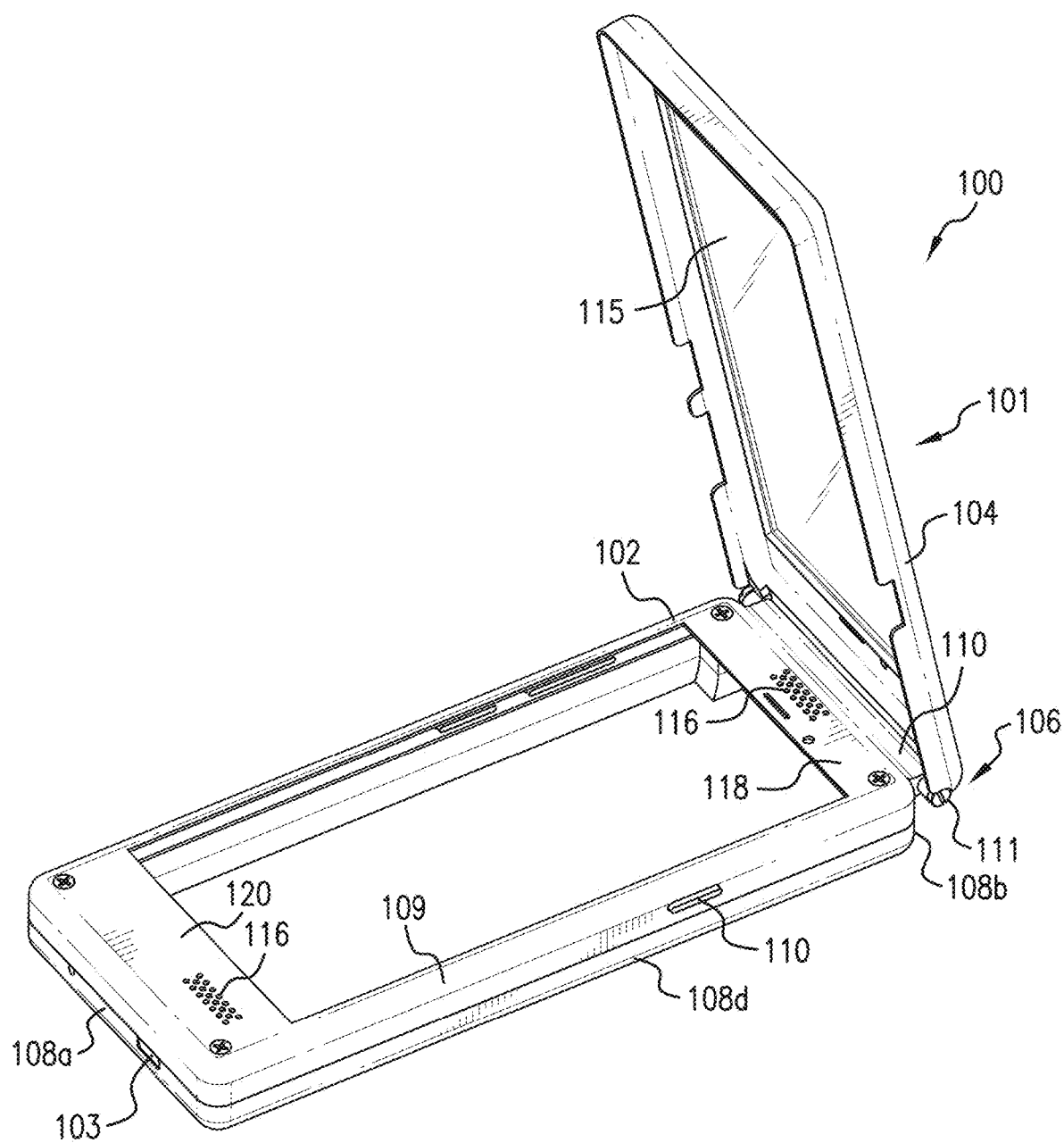
FIG. 4 shows a front-side perspective view of the case of FIG. 1 with the front cover open.
Figure 5:
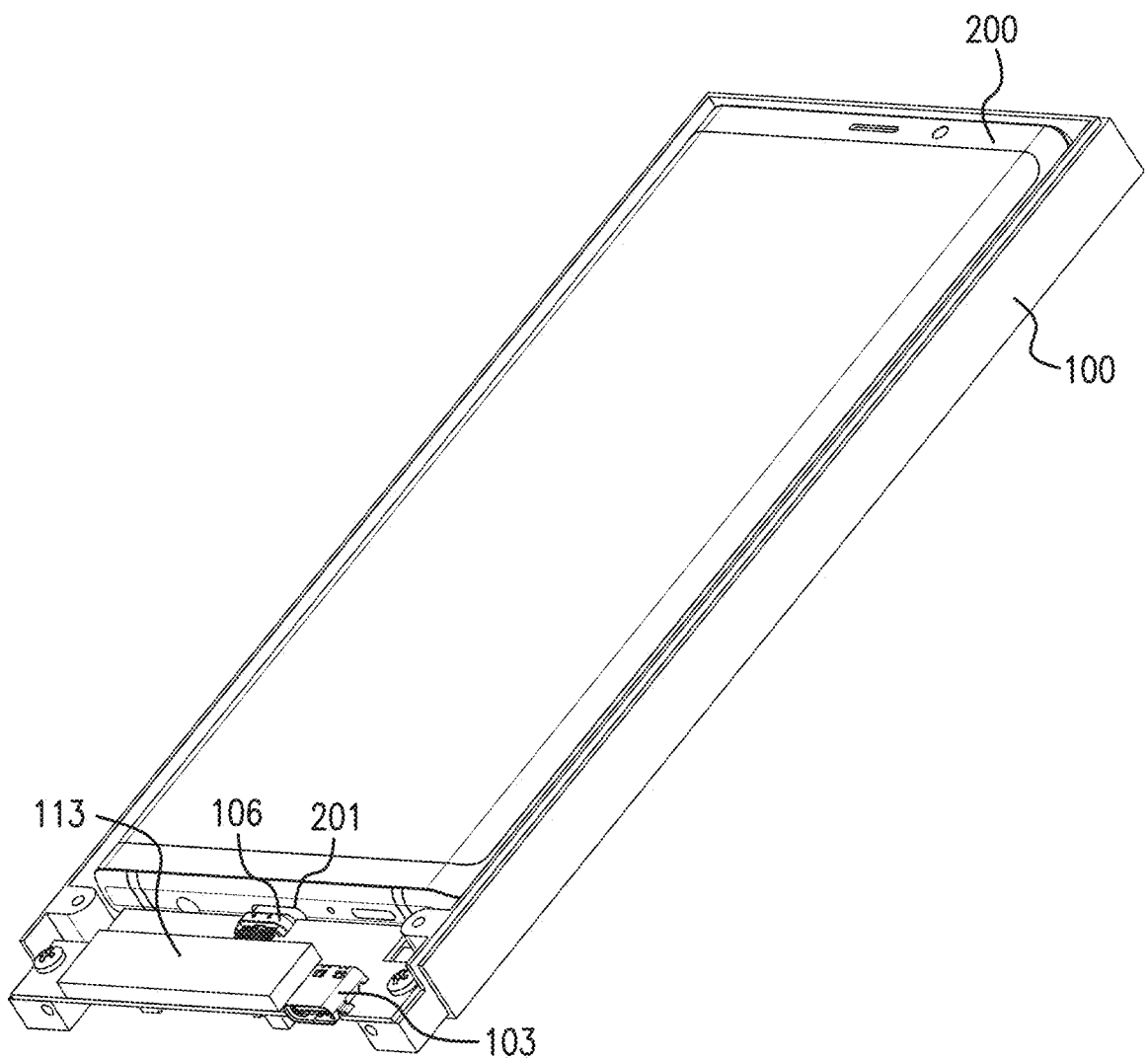
FIG. 5 shows a front perspective of the case of FIG. 1 with the top cover removed.

Turning to FIG. 4, shown is case 100 with top cover 104 of enclosure 101 opened. Bottom portion 102 of enclosure 101 is revealed to show a top covering portion 118 and a bottom covering portion 120 each of which extend from perpendicular inward from the top of side wall 108d and 108c, respectively, to cover portions of the corresponding top and bottom of mobile device 200, respectively. In this way one or more hole patterns 116 are placed in each of top covering portion 118 and bottom covering portion 120 to align with speaker and microphone holes on mobile device 200.

In an embodiment, a small hole sufficient for the front camera lens typical of mobile devices 200 can be placed on top portion aligned with the camera lens location on mobile device 200. Such a hole is only protected against EMP while the top cover 104 is closed. A rear camera lens opening may also be provided in back side 107 of bottom portion 102, but doing so places a significant aperture in the Faraday cage which may result in damage to mobile device 200. One skilled in the art will observe that a pivoted or hinged metal cover may be installed to cover such an aperture when not in use, preserving the integrity of the Faraday cage of enclosure 101. However, similar to opening the top cover 104, the protected device is susceptible to damage while the protective cover is open.

Accessing pushbuttons typical of mobile device 200 while mounted in case 100 requires button extender 110. Button extender 110 comprises of a T-shaped plunger with the "head" of the "T" resting on the button of mobile device 200 inside enclosure 101 with the shaft of the plunger passing through a hole in side wall 108d of enclosure 101 of case 100 with 0.001-0.003 inch clearance and protruding a distance and in a location where the user can easily press button extender 110 and indirectly press the button on mobile device 200. The narrow tolerance gap around the button extender 110 meets the one-tenth wavelength criterion for any holes in case 100 for EMP protection. Simultaneously, the "T" head of button extender 110 inside the case provides a circuitous radio energy path to enhance rejection of damaging power. Button extender 110 can be provided for all of the physical buttons on mobile device 200, including the volume up, volume down, and power buttons. A similar button extender 110 can be provided in any of side walls 108a, 108b, 108c, or 108d or in top cover 104 to engage any button on mobile device 200. If mobile device 200 is implemented as a cellular phone with a tactile, physical keyboard for inputs, the foregoing button extenders 110 can be provided for every input to provide mobile device 200 with full functionality inside enclosure 101 without opening top cover 104 of enclosure 101.

Mobile device 200 also has vibration from an internal vibrator motor in mobile device 200 which can be transmitted through case 100 without an impact to EMP protection. Enclosure 101 can comprise a shock-absorbing elastomer 112 on the inside to protect mobile device 200 from falls and other impacts.

Case 100 also comprises electronic circuitry to allow mobile device 200 to communicate with cellular towers, charging and access to peripherals. This circuitry can all be located on a small printed circuit board 113 inside enclosure 101. For mobile device 200 to function properly while in case 100, primary power and digital signals through enclosure 101 to the circuitry must be allowed. Damaging signals will be conducted over any/all wires penetrating a Faraday cage and entering the volume of space where the protected device is located, which means protection circuits must be installed to shunt any damaging energy from an EMP.

Figure 6:
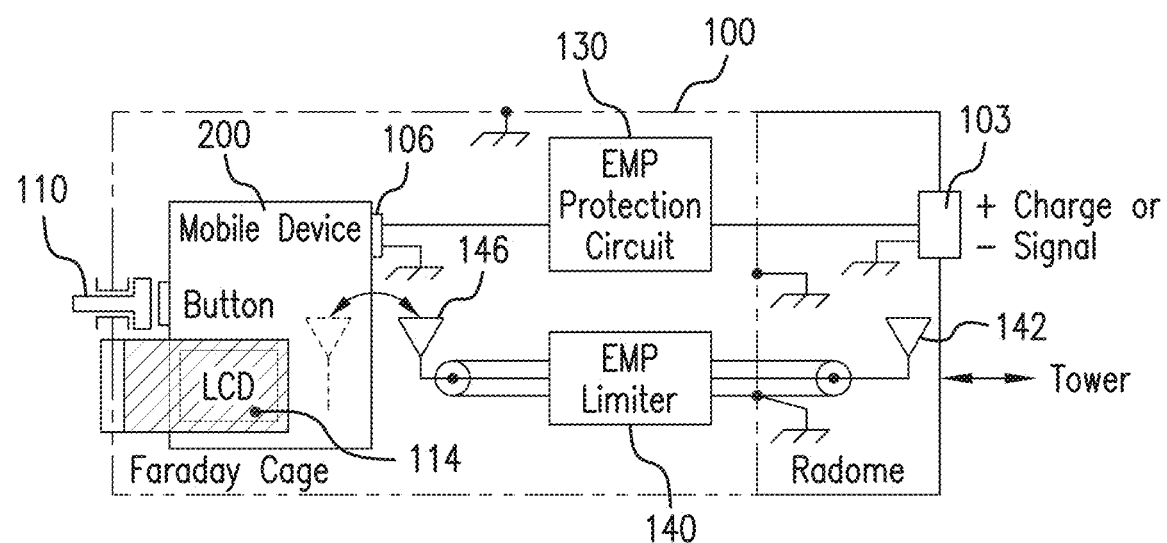
FIG. 6 shows an electrical schematic for protecting a mobile device from an electromagnetic pulse according to this disclosure.

Turning to FIG. 6, shown is block diagram of mobile device 200 inside case 100. As illustrated, an EMP protection circuit 130 and an EMP limiter 140 in a passive relay are each installed in series with each signal conductor to shunt the damaging energy to the Faraday cage surface (i.e. surface of enclosure 101) of case 100 for dissipation along with the circulating surface currents. A filter implemented as EMP protection circuit 130 and EMP limiter 140 that attenuate all interfering energy (primarily 10-1000 MHz for EM pulse) by at least 80 decibels and pass only the desired signals are disclosed.

Figure 7A:
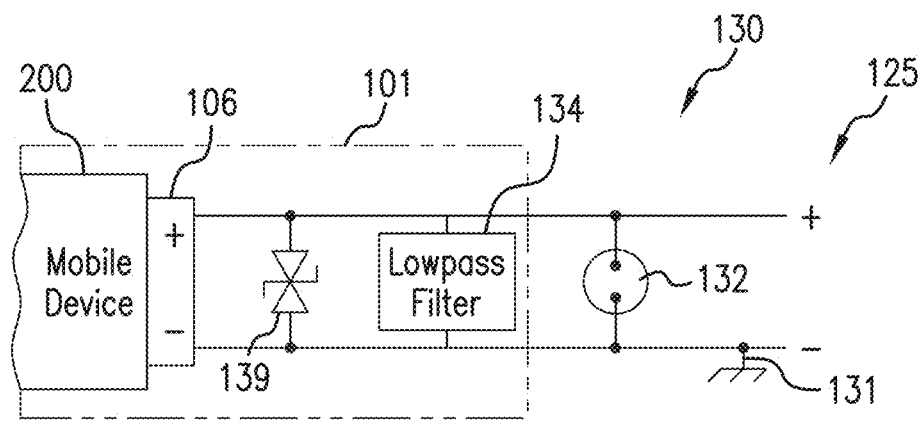
FIG. 7A shows an electrical schematic for the power EMP protection circuit.

FIG. 7A shows a schematic of EMP protection circuit 130. Side wall 108a of enclosure 101 comprises of external charging and data port 103, which comprises of a power input port 124, which further comprises of positive and negative terminals. A gas discharge tube 132 is connected in shunt across the positive and negative terminals of power input port 124 outside of the Faraday cage created by enclosure 101. Gas discharge tube 132 is capable of withstanding thousands of volts and thousands of amperes for the duration of an EMP pulse. The excessively high voltage and amperage induction is presumed due to the long charging cables most users use, which also would induce a large EMP voltage spike. With gas discharge tube 132 connected to ground 131 and to enclosure 101 of case 100, damaging energy from an EMP is dissipated along with circulating surface currents on enclosure 101.

Figure 7B:
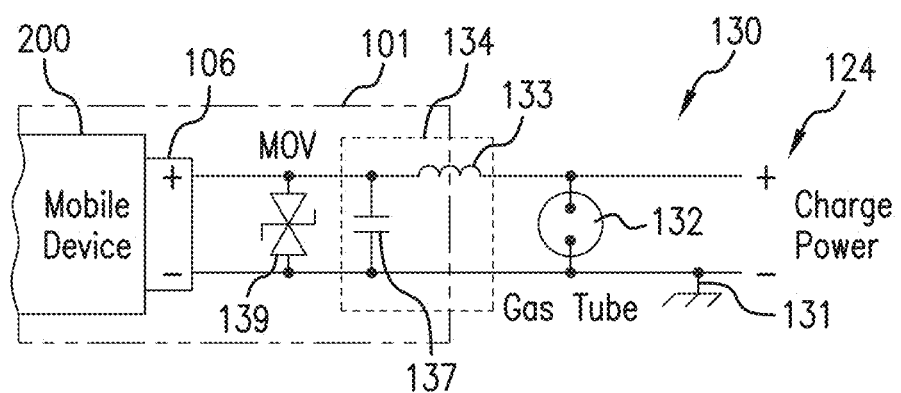
FIG. 7B shows another electrical schematic for the power EMP protection circuit.
Figure 7B:
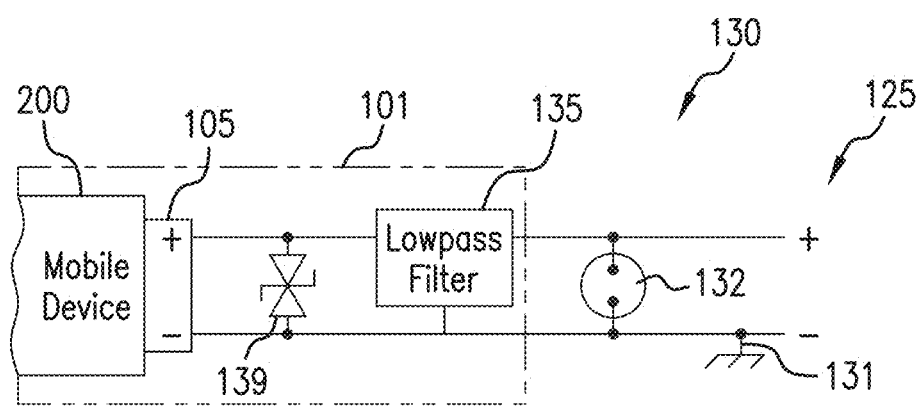

Input port 124 is connected in series to a filter 134 inside enclosure 101. Filter 134 is tuned to pass or limit the desired frequencies. A more specific implementation of filter 134 is shown in FIG. 7B. Filter 134 can be implemented as a low pass filter for the charging circuit and comprise an LC circuit tuned to pass a DC charging voltage and 60 Hz AC voltages. Filter 134 implemented as a low pass filter can comprise an inductor 133 and a capacitor 137 of the appropriate size for purposes of tuning to the desired frequencies. A voltage suppressor 139, such as a metal oxide varistor (MOV) or transient voltage suppressor is connected in shunt across internal charging and data port 106 (e.g., USB or Lightning connector) to suppress all over-voltages as secondary protection to gas discharge tube 132.

Digital signals are also commonly provided with power through external charging and data port 103. In the case of digital signals, lowpass filters are again a useful solution for static or low frequency signaling. However, when the signal frequency enters the EMP spectral range (i.e., a 10-100-1000 Mbps Ethernet signal), the problem becomes more difficult to solve.

In this case, the circuit of FIG. 7A is again used, but with the cut-off frequency of the lowpass filter 134 adjusted upward to the data rate of the data signal. The USB data rate used in mobile devices rarely exceeds 100 MHz, but this represents approximately 10% of the EMP energy spectrum. In this case, we rely on the TVS protector to clip any high voltage spikes passing through the lowpass filter 134 so as not to cause damage to mobile device 200. This solution may at worst prevent successful data reception for a few data pulse durations for the direction of an EMP pulse. One skilled in the art will recognize that EMP protection circuit 130 of FIGS. 7A and 7B can be implemented for each data signal line 125 in external charging and data port 103.

In many cases, however, the signal requires a wide bandwidth (Ethernet and USB are examples), which essentially requires passing the EMP spectrum along with the desired signal spectrum. In this case, rather than limiting the incoming spectrum, it becomes necessary to limit the incoming signal amplitude. EMP protection circuit 130 is designed for shorting out to the surface of the Faraday cage of enclosure 101 the signal line's induced EM pulse energy for its 100-200 nanosecond duration. This can be accomplished with voltage suppressor 139 (e.g., Zener diode, TVS diode, Metal Oxide Varistor, gas discharge tube, etc.), which is a high impedance (and hence transparent to normal circuit operations) when the signal line which it is shunting to ground 131 has less than the threshold voltage. When an EMP appears, EMP protection circuit 130 quickly avalanches to a near-zero impedance state, shunting the pulse energy to the surfaces of case 100. This protection does disable desired operation of the signal line for the duration of the EM pulse, but protects the circuitry.

It is also contemplated that mobile device 200 with wireless charging capability also functions inside case 100. Wireless phone chargers operate at very low frequencies, below the spectrum of an EMP, and are also magnetic fields. This means that wireless charging would work through case 100, which is a non-magnetic case (e.g., aluminum) without any protection features.

Figure 8:
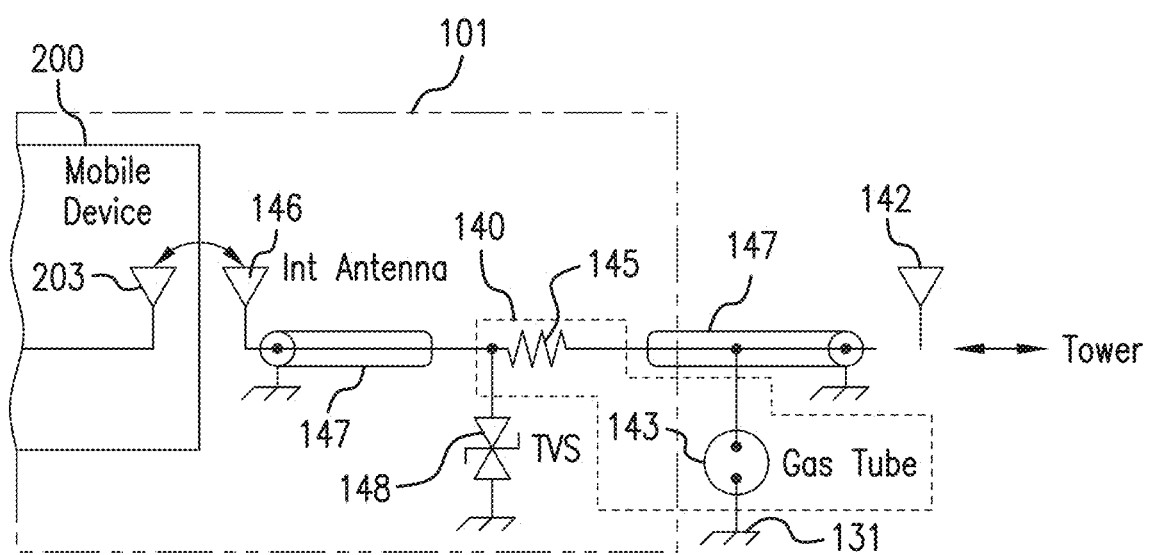
FIG. 8 shows an electrical schematic for a passive radio relay with EMP protection according to this disclosure.

Case 100 must also be able to pass communication signals to and from mobile device 200. It is well known to all skilled in antenna design and application that all antennas both receive and radiate electromagnetic energy simultaneously. FIG. 8 shows a passive radio relay 140 comprising of two identical cellular antennas connected by a coaxial cable with EMP limiter 140 between them. One antenna is external repeater antenna 142, and is located outside the Faraday cage of enclosure 101. The other identical antenna is internal repeater antenna 146 and is located inside the Faraday cage of enclosure 101 adjacent to the internal antenna 203 of mobile device 200 and coupling signal power into/out of it. Each of external repeater antenna 142 and internal repeater antenna 146 inherently comprise band limiting properties reducing coupled EMP energy.

In transmit, internal antenna 203 of mobile device 200 couples energy into internal repeater antenna 146. That energy travels through transmission line 147, which can be implemented as coaxial cable, and limiter circuit 140 (both of which are described below) to external repeater antenna 142, where it is radiated, ultimately arriving at a cell tower. In receive, the signal power from the cell tower is received by external repeater antenna 142, passes through transmission line 147 through the limiter circuit 140, and is applied to internal repeater antenna 146, where it is radiated and coupled into the internal antenna 203 of mobile device 200. The inherent resonant nature of the repeater antennas (as well as the cellphone antenna and its internal bandpass filters in receive and transmit) further help reduce the spectral content of EMP energy reaching mobile device 200.

Because enclosure 101 is conductive, it will block EM waves from entering the case, except as specifically allowed as described herein. Case 100 is configured to allow high frequency electromagnetic energy through enclosure 101 of case 100 to the radio circuitry of mobile device 200 for sending and receiving communication signals, so that mobile device 200 continues to function while inside enclosure 101 of case 100.

FIG. 8 shows the electrical schematic for EMP limiter 140 of FIG. 6 implemented in a passive radio relay with EMP protection. The passive radio relay comprises of external repeater antenna 142 positioned outside enclosure 101 of case 100 connected to a transmission line 147 that passes through enclosure 101 and is connected to internal repeater antenna 146. Internal repeater antenna 146 EM-couples with antenna 203 of mobile device 200 and relays signals to and from antenna 203 of the mobile device 200.

An EMP limiter 140 connected in the passive repeater attenuates voltages above a threshold. EMP limiter 140 can comprise of a gas discharge tube 143 outside of enclosure 101 connected in shunt from transmission line 147 to ground 131. Gas discharge tube 143 is capable of withstanding thousands of volts and thousands of amperes for the duration of an EMP pulse. With gas discharge tube 143 connected to ground 131 and to enclosure 101 of case 100, damaging energy from an EMP is dissipated along with circulating surface currents on enclosure 101. EMP limiter 140 also comprise of an internal resistor 145 to limit the current.

EMP limiter 140 can be located on a small printed circuit board along with the printed circuit mounted internal repeater antenna 146 (discussed below). EMP limiter 140 is designed for the type of mobile device 200. For mobile device 200 configured to communicate using narrowband signals, EMP limiter 140 can be implemented as a bandpass filter. For wideband communication, EMP limiter 140 can be implemented as an amplitude limiter. If mobile device 200 only receives signals (e.g., a pager or the like), amplitude protection necessary for receiving signals is minimal because the desired signal has microscopic power. For mobile device 200 that transmits signals, however, the amplitude limiter of EMP limiter 140 becomes more complex as the transmitter power level rises. When the power level is high enough, the high power transmitter output circuit alone may be capable of withstanding the EMP pulse.

An internal repeater antenna 146 is provided inside enclosure 101 connected either directly to EMP limiter 140 or connected to a transient suppression component 148 (e.g., Zener diode, TVS diode, Metal Oxide Varistor, gas discharge tube, etc.) with a high impedance when the signal line which it is shunting to ground has less than the threshold voltage. Particularly noteworthy is that both internal repeater antenna 146 and external repeater antenna 142 of this passive repeater utilizes the ground-plane of the Faraday cage of enclosure 101, which is connected to ground 131.

In operation, transmit signals are relayed from the antenna 203 internal to mobile device 200 to internal repeater antenna 146 and out of enclosure 101 through transmission line 147 to external repeater antenna 142. Receive signals are received at external repeater antenna 142 which are passed through transmission line 147 to internal repeater antenna 146 and then relayed to antenna 203 of mobile device 200. In an EMP event, excessive signals are attenuated by protection circuit 144 and transient suppression component 148.

One skilled in the art will recognize that case 100 can protect any device susceptible to neutralization from an EM pulse. In this regard, mobile device 200 means any type of communication device such a mobile phone, pager, any type of transmitter, any type of receiver, etc., and any type of non-radio or non-communication devices, as well. Also, any of the filters discussed in reference to a particular embodiment, circuit or drawing can be used in any other embodiment, circuit or drawing based on the technical requirements.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

I claim:

1. A case for a mobile device, comprising:
an enclosure selectively operable to open and receive the mobile device therein and to substantially attenuate electro-magnetic (EM) radiation in a radio spectrum to non-damaging amplitudes wherein a portion of the enclosure that aligns with a display of the mobile device simultaneously substantially attenuate EM radiation to non-damaging amplitudes and is transparent to visible light in an optical spectrum;
an external charging and data port on the outside of the enclosure;
an internal charging and data port on the inside of the enclosure configured to receive the charging and data port of the mobile device; and
an EMP protection circuit electrically connected between the external charging and data port and the internal charging and data port.

2. The case of claim 1, and further comprising a passive repeater configured to EM-couple with an antenna of the mobile device and relay signals to and from the antenna of the mobile device.

3. The case of claim 2, and further comprising an EMP limiter connected to the passive repeater to attenuate voltages above a threshold.

4. The case of claim 2, wherein the passive repeater further comprises: an internal repeater antenna inside the enclosure and configured to EM-couple with an antenna of the mobile device, an external repeater antenna positioned outside of the enclosure, and a transmission line extending between the internal repeater antenna and the external repeater antenna.

5. The case of claim 4, wherein the internal repeater antenna and the external repeater antenna each inherently comprise band limiting properties reducing coupled EMP energy.

6. The case of claim 1, wherein the EMP protection circuit further comprises of a low pass filter to pass a dc charging voltage and data signal to the mobile device.

7. The case of claim 1, wherein the EMP protection circuit further comprises a voltage suppressor connected in shunt across the internal charging and data port.

8. The case of claim 1, wherein the EMP protection circuit further comprises a voltage suppressor connected in shunt across the external charging and data port.

9. The case of claim 8, wherein the voltage suppressor further comprises of a gas discharge tube.

10. The case of claim 9, wherein the voltage suppressor is connected to the outside of the enclosure which functions as a ground plane.

11. The case of claim 1, wherein the enclosure further comprises of a bottom portion for cradling the mobile device therein and a top cover connected to the bottom portion by an electrically-conductive hinge to both selectively open and close the enclosure and provide a low-impedance electrical path between bottom portion and the top cover of the case.

12. The case of claim 11, wherein the top cover has orthogonal sidewalls extending downward that overlap orthogonal sidewalls of the bottom portion to reduce a radiation leakage path.

13. The case of claim 11, wherein the top cover further comprises the portion of the enclosure that aligns with the display on the mobile device, wherein such portion further comprises of a metallic mesh that simultaneously substantially attenuates EM radiation and is transparent to visible light in an optical spectrum.

14. The case of claim 13, where the metallic mesh of the top cover is oriented with its threads at a 45 degree angle to an x-y orientation of a display of the mobile device for preventing Moire patterns and enhancing clarity of the display.

15. A case for a mobile device, comprising:
an enclosure comprising;
a bottom portion for cradling the mobile device therein;
a top cover;
an electrically-conductive hinge connecting the bottom portion to the top cover to both selectively open and close the emclosure and provide a low-impedance electrical path between bottom portion and the top cover of the case; and an external charging and data port on the outside of the enclosure; an internal charging and data port on the inside of the enclosure configured to receive the charging and data port of the mobile device; and an EMP protection circuit electrically connected between the external charging and data port and the internal charging and data port.

16. The case of claim 15, and further comprising: a passive repeater configured to EM-couple with an antenna of the mobile device and relay signals to and from the antenna of the mobile device; an EMP limiter connected to the passive repeater to attenuate voltages above a threshold, wherein the passive repeater further comprises: an internal repeater antenna inside the enclosure and configured to EM-couple with an antenna of the mobile device, an external repeater antenna positioned outside of the enclosure, and a transmission line extending between the internal repeater antenna and the external repeater antenna.

* * * * *